United States Patent
McClure

(10) Patent No.: US 7,015,528 B2
(45) Date of Patent: Mar. 21, 2006

(54) REDUCED ASPECT RATIO DIGIT LINE CONTACT PROCESS FLOW USED DURING THE FORMATION OF A SEMICONDUCTOR DEVICE

(75) Inventor: Brent A. McClure, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/807,952

(22) Filed: Mar. 23, 2004

(65) Prior Publication Data

US 2004/0178435 A1   Sep. 16, 2004

Related U.S. Application Data

(62) Division of application No. 09/765,885, filed on Jan. 16, 2001, now Pat. No. 6,709,945.

(51) Int. Cl.
*H01L 29/72* (2006.01)

(52) U.S. Cl. .................. 257/306; 257/307; 257/308

(58) Field of Classification Search ............... 257/306, 257/307

See application file for complete search history.

(56) References Cited

U.S. PATENT DOCUMENTS

| | | | |
|---|---|---|---|
| 4,656,732 A | 4/1987 | Teng et al. ............. | 438/639 |
| 5,144,579 A | 9/1992 | Okabe et al. ............ | 365/149 |
| 5,338,700 A | 8/1994 | Dennison et al. ........ | 438/253 |
| 5,401,681 A | 3/1995 | Dennison ................ | 438/253 |
| 5,834,845 A | 11/1998 | Stolmeijer .............. | 257/752 |
| 5,843,830 A | 12/1998 | Graettinger et al. ..... | 438/396 |
| 5,844,771 A | 12/1998 | Graettinger et al. ..... | 361/303 |
| 5,869,861 A | 2/1999 | Chen ..................... | 257/308 |
| 5,956,594 A | 9/1999 | Yang et al. ............. | 438/396 |
| 5,989,952 A | 11/1999 | Jen et al. ............... | 438/253 |
| 6,046,093 A | 4/2000 | DeBoer et al. .......... | 438/398 |
| 6,100,137 A | 8/2000 | Chen et al. ............. | 438/253 |
| 6,127,260 A | 10/2000 | Huang ................... | 438/629 |
| 6,134,137 A | 10/2000 | Kurth et al. ............ | 365/149 |
| 6,140,172 A | 10/2000 | Parekh .................. | 438/238 |
| 6,168,984 B1 | 1/2001 | Yoo et al. .............. | 438/239 |
| 6,187,624 B1 | 2/2001 | Huang ................... | 438/253 |
| 6,190,960 B1 | 2/2001 | Noble ................... | 438/253 |
| 6,221,711 B1 | 4/2001 | Roberts et al. .......... | 438/239 |
| 6,251,726 B1 | 6/2001 | Huang ................... | 438/253 |
| 6,300,191 B1 | 10/2001 | Yu et al. ................ | 438/253 |
| 6,507,064 B1 * | 1/2003 | Tang et al. ............. | 257/306 |

* cited by examiner

*Primary Examiner*—Edward Wojciechowicz
(74) *Attorney, Agent, or Firm*—Kevin D. Martin

(57) ABSTRACT

A method used during the formation of a semiconductor device comprises forming a first portion of a digit line contact plug before forming storage capacitors. Subsequent to forming storage capacitors, a second portion of the digit line plug is formed to contact the first portion, then the digit line runner is formed to contact the second plug portion. A structure resulting from the process is also described.

18 Claims, 15 Drawing Sheets

REDUCED ASPECT RATIO DIGIT LINE CONTACT PROCESS FLOW USED DURING THE FORMATION OF A SEMICONDUCTOR DEVICE

This is a division of U.S. Ser. No. 09/765,885 filed Jan. 16, 2001 and issued Mar. 23, 2004 as U.S. Pat. No. 6,709,945.

FIELD OF THE INVENTION

This invention relates to the field of semiconductor processing, and more particularly to a method for forming a contact and a container capacitor for a semiconductor device such as a dynamic random access memory.

BACKGROUND OF THE INVENTION

During the manufacture of a semiconductor device such as dynamic random access memories (DRAMs), static random access memories (SRAMs), microprocessors, and logic devices, several structures are commonly formed. For example, contact openings to a conductive layer such as doped monocrystalline silicon wafer, a polycrystalline silicon (polysilicon) layer, or a metal feature through a dielectric layer such as tetraethyl orthosilicate (TEOS) and/or borophosphosilicate glass (BPSG) can be formed. Further, openings are commonly formed within a dielectric layer as an early step in the formation of a container capacitor in a memory device.

FIGS. 1–6 depict a conventional process used during the formation of a semiconductor memory device such as a DRAM to form storage capacitors and digit line contacts. FIG. 1 depicts a semiconductor wafer substrate assembly comprising a semiconductor wafer 10, field oxide 12, doped wafer areas 13, transistor control gates typically comprising a polysilicon gate 14A and silicide 14B, and surrounding dielectric typically comprising gate oxide 16A, nitride spacers 16B, and capping layer 16C, for example TEOS. FIG. 1 further depicts polysilicon contact pads including pads 18 to which container capacitors will be electrically coupled and pads 20 which will form a portion of a digit line contact to the wafer 10. The pads are separated by a dielectric layer 22, for example BPSG. Also depicted is a second layer of dielectric 24 which can be one or more layers of TEOS and/or BPSG. A layer of photoresist 26 defines openings 28 which overlie pads 18 to which the container capacitors will be electrically coupled. The structure of FIG. 1 is exposed to a vertical anisotropic etch which removes the dielectric layer 24 selective to the polysilicon contact pads 18.

FIG. 2 depicts openings 30 which result from the etch of the FIG. 1 structure. The etch exposes pads 18, which in turn contact doped regions 13. Pads 18, therefore, decrease the amount of oxide which the etch of the FIG. 1 structure must remove. Without pads 18, the etch would be required to remove the additional thickness of oxide layer 22 to expose doped regions 13.

After forming the openings, a blanket layer of hemispherical silicon grain (HSG) 32 is formed over exposed surfaces including pads 18. Subsequently, the openings are filled with a sacrificial protective material such as photoresist (not depicted) and the HSG and a portion of dielectric 24 are etched, for example using chemical mechanical polishing (CMP). This removes the HSG from the horizontal surface of dielectric 24. Any protective material remaining within opening 30 is removed.

Next, blanket layers of cell nitride 34 and top plate polysilicon 36 are formed over the surface of the assembly as depicted in FIG. 3. A patterned photoresist layer 38 is provided which defines the storage nodes and capacitor top plate. After the etch, the photoresist 38 is removed.

As depicted in FIG. 4 another dielectric layer 40 such as BPSG is deposited and planarized and a patterned photoresist 42 is formed over dielectric 40. Opening 44 within the photoresist layer overlies the digit line contact pad 20. A vertical anisotropic etch is performed which etches through dielectric layers 40 and 24 to provide a contact opening 50 and to expose the digit line contact pad 20 as depicted in FIG. 5. The etch exposes pad 20, which in turn contacts doped region 13. Pad 20, therefore, decreases the amount of oxide which the etch of the FIG. 4 structure must remove. Without pad 22, the etch would be required to remove the additional thickness of oxide layer 22 to expose doped region 13. Finally, as depicted in FIG. 6, a conductive plug 60 typically comprising tungsten is formed within opening 50 and a metal digit line runner 62, typically aluminum, is formed over dielectric layer 40 to electrically contact the plug 60 to provide a digit line.

One problem with a process such as that described above is that the etch of the digit line contact opening 50 to expose the digit line contact pad 20 requires etching through a very thick series of dielectric layers. With current processes the ratio of the contact opening height to the width (i.e. the "aspect ratio") can be 10:1 or greater. For example, layer 24 depicted in FIG. 4 can have a thickness of 14,000 angstroms (Å) or more, and layer 40 can have a thickness of 4,000 Å for a total of 18,000 Å of dielectric to etch through to form a contact about 1,150 Å wide for an aspect ratio of about 15:1. As the aspect ratio of openings increases the opening becomes increasingly difficult to form reliably. Contact locations in a periphery of a semiconductor device (see 174 in FIG. 17, for example) often do not have pads 18, 20 which further increases the aspect ratio. Problems forming high aspect ratio contacts include difficulty in etching the bottom portion of the dielectric layer, in maintaining the proper diameter of toward the top of the opening, and in filling the contact opening with conductive material subsequent to its formation.

A method for forming a contact opening which reduces or eliminates the problems described above would be desirable.

SUMMARY OF THE INVENTION

The present invention provides a new method that reduces problems associated with the manufacture of semiconductor devices, particularly problems resulting from contact etches and fills requiring a high aspect ratio. In accordance with one embodiment of the invention a portion of a digit line contact opening is etched to expose a digit line contact pad, then the opening is filled with conductive material to form a digit line contact plug to the pad. A storage capacitor is subsequently formed and the remainder of the digit line plug and digit line runner are formed. This process decreases the aspect ratio of the contact openings which must be formed, and may provide increased capacitance of the storage capacitor by allowing an increased height of the capacitor as will be described in detail below.

Other advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 7:
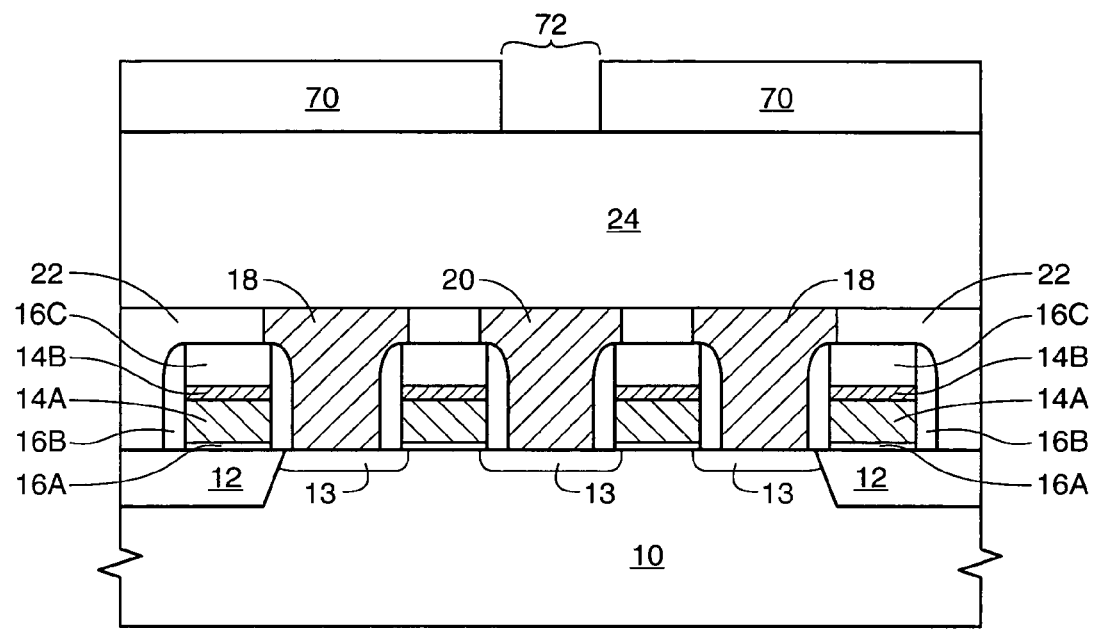
FIG. 7 is a cross section of a first embodiment of the invention having a patterned photoresist layer which defines a digit line contact opening in a dielectric layer.

A first embodiment of an inventive method used during the formation of a semiconductor device is depicted in FIGS. 7–14. FIG. 7 depicts a semiconductor substrate assembly comprising a semiconductor substrate such as a wafer 10, field oxide 12, a transistor control gate comprising a polysilicon gate 14A and silicide 14B, surrounding dielectric including gate oxide 16A, nitride spacers 16B, and capping dielectric 16C, for example comprising tetraethyl orthosilicate (TEOS) and nitride. FIG. 7 further depicts capacitor storage node contact pads 18 comprising polysilicon, a digit line contact pad 20 comprising polysilicon, and an overlying dielectric 24 such as borophosphosilicate glass (BPSG) which has been chemically-mechanically planarized (CMP) to about 14,000 Å thick in this exemplary embodiment in accordance with the conventional device described above. A patterned photoresist layer 70 defines an opening 72 to the digit line contact pad 20. The structure depicted in FIG. 7 can be manufactured by one of ordinary skill in the art from the description herein.

After forming the FIG. 7 structure, BPSG layer 24 is etched to expose the digit line contact pad 20. An etch comprising an atmosphere of $CHF_3$ at a flow rate of 50 standard cubic centimeters (sccm), a temperature of about 50° C., and a pressure of about 15 millitorr (mT) would remove about 40 Å of oxide/minute. Thus for a BPSG layer 24 between about 14,000 Å as described above, a duration of about 5.8 minutes would be sufficient. The contact opening at the bottom, in accordance with the conventional embodiment described above, should have a minimum width at the bottom of 1,150 Å.

Figure 8:
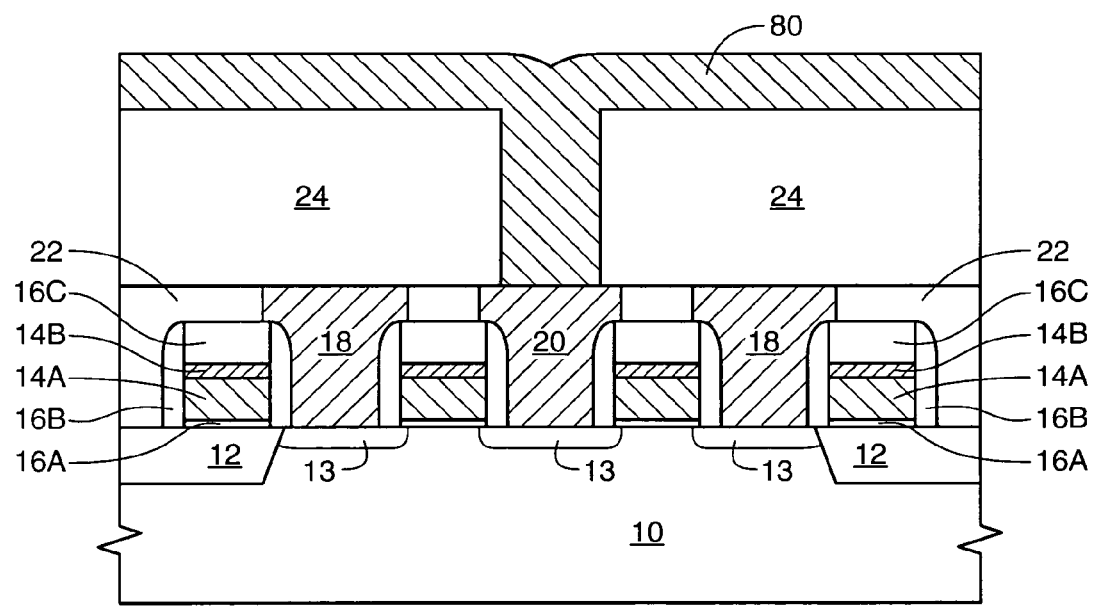
FIG. 8 is a cross section of the FIG. 7 structure subsequent to etching the dielectric layer and forming a blanket conductive plug layer within the opening.

Subsequently, a blanket metal layer 80, for example tungsten, is formed within the opening in BPSG 24 and overlying the BPSG layer as depicted in FIG. 8. A tungsten layer having a thickness of at least half as thick as the maximum width of opening 72 which defines the opening in the BPSG 24 can be formed using tungsten hexafluoride, $WF_6$, and silane, $SiH_4$, to begin the tungsten deposition. The silane provides a silicon source to tie up free fluorine atoms which can damage the substrate. After the initial layer of tungsten is produced, the deposition process is enhanced by replacing the silane with hydrogen gas.

Figure 9:
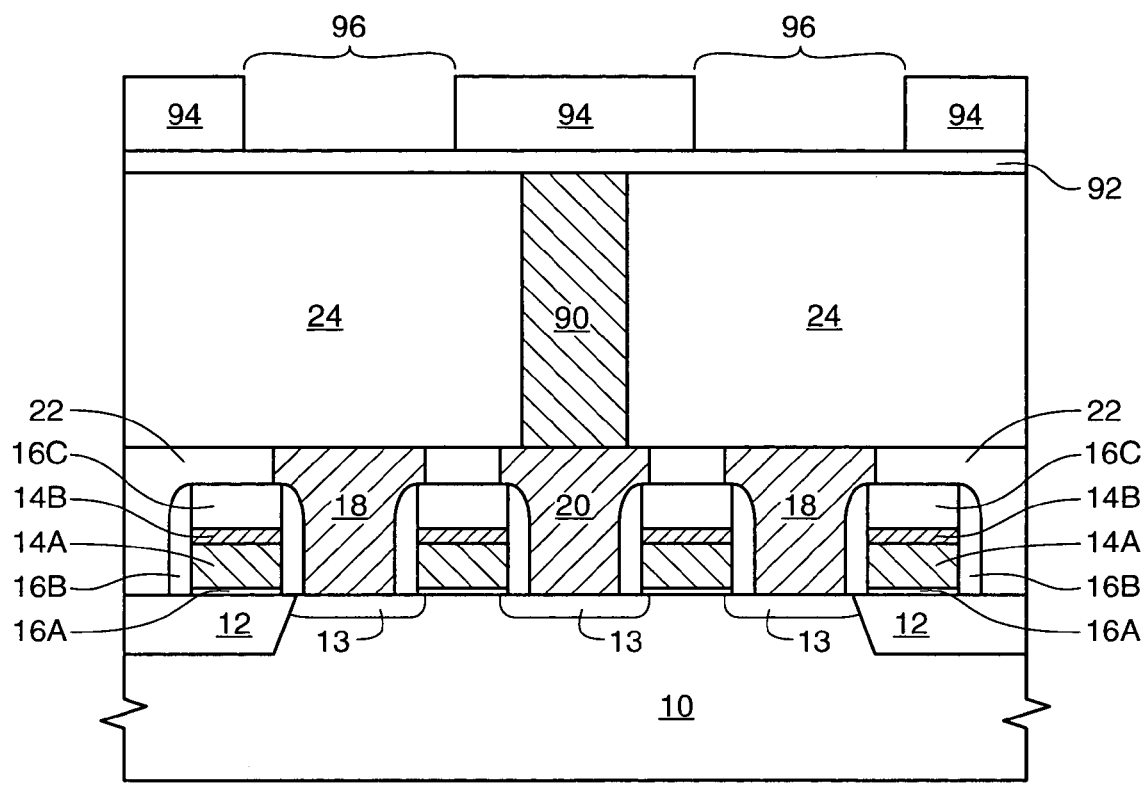
FIG. 9 is a cross section of the FIG. 8 structure after planarizing the blanket plug layer to form a first portion of a digit line contact plug and after forming a blanket dielectric layer over the first conductive plug portion and a patterned photoresist layer which defines the container capacitor in a dielectric layer.

Next, the structure of FIG. 8 is planarized, for example using chemical mechanical polishing (CMP) with an ammonia-based slurry, to remove the metal overlying dielectric 24 and leaving a metal plug 90 within dielectric 24 as depicted in FIG. 9.

Another blanket dielectric layer 92 such as a TEOS layer between about 150 Å and about 250 Å, preferably about 200 Å, is deposited over the plug 90 and the BPSG layer 24. TEOS can be formed using a liquid source such as $Si(OC_2H_5)_4$ introduced into a low pressure chemical vapor deposition (LPCVD) furnace between about 690° C. and about 720° C. Other materials may also function for dielectric layer 92 such as a nitride, an oxynitride, or other similar diffusion barriers which are sufficient to prevent lower metal layers such as silicide gate portions 14B from oxidizing.

A patterned photoresist layer 94 is formed over the TEOS layer 92 to define openings 96 to container capacitor contact pads 18. An anisotropic oxide etch is performed on the structure of FIG. 9 to etch TEOS 92 and BPSG 24 to expose container capacitor contact pads 18 and to define the container capacitor. The oxide etch described previously relative to BPSG would sufficiently remove the TEOS and BPSG layers. The photoresist is removed.

Figure 10:
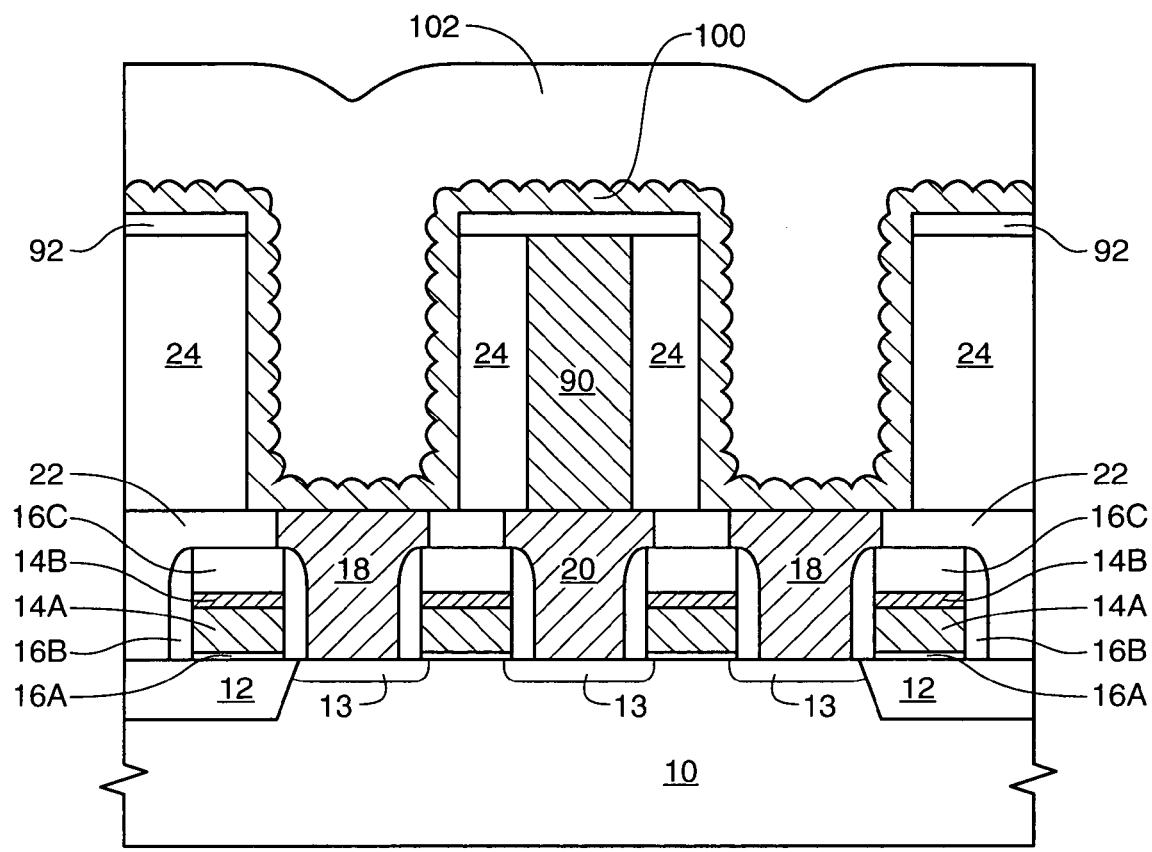
FIG. 10 depicts the structure of FIG. 9 subsequent to etching the dielectric layer to define the container capacitor, and subsequent to forming a blanket HSG layer and a protective photoresist layer within recesses defined by the HSG.

Subsequently, a capacitor storage node layer 100 is formed over exposed surfaces as depicted in FIG. 10 and makes electrical contact with container capacitor contact pads 18. The storage node layer can be formed using any number of workable processes. For example, a texturized polysilicon layer having a nominal thickness of between about 300 Å and about 1,500 Å can be formed using an in situ polysilicon in an LPCVD furnace at about 535° C. using silane and phosphine ($PH_3$) as source gasses. The wafer is moved to an oxidation furnace to receive a phosphorous deposition to a conductivity of between about 1E18 atoms/$cm^3$ to about 5E21 atoms/$cm^3$. A native oxide will form on the polysilicon surface. The wafer is subjected to a 60 second 100:1 hydrofluoric acid bath, which results in partial removal of the native oxide such that thin patches of oxide remain. Next, hemispherical silicon grain (HSG) is formed over the in situ polysilicon layer in an LPCVD furnace at 555° C. using silane gas. The small oxide patches on the in situ surface give the polysilicon layer a rough surface. A target polysilicon thickness of between about 500 Å and about 3,000 Å would be sufficient depending on the width of the opening, and other thicknesses may be sufficient. Contact pads 18 are electrically coupled by physical contact with storage node 100 layer and with doped regions 13.

After forming HSG layer 100, the recess defined by the layer is filled with a sacrificial layer 102 such as photoresist. The surface of the FIG. 10 structure is then planarized, for example using CMP, to remove the HSG from the horizontal surface of the dielectric 92. The HSG within the opening remains to form the container capacitor storage plate. The thickness of material removed from the structure should be small enough so that a portion of dielectric layer 92, for example at least about 100 Å remains subsequent to planarization. After this planarization step, the photoresist layer 102 is removed.

Next, a cell dielectric layer 110 such as cell nitride and a top plate layer 112 such as polysilicon are formed over the exposed surfaces. A cell nitride layer between about 85 Å and 105 Å can be deposited by processing the wafer in an LPCVD furnace using dichlorosilane ($SiH_2Cl_2$) and ammonia ($NH_3$) gasses. A 2,000 Å polysilicon top plate layer can be formed in an LPCVD furnace at about 620° C. using an atmosphere of silane gas ($SiH_4$), or by using another workable method. As the polysilicon forms at a rate of about 4,000 Å/hr, the process is performed for about 30 minutes to form the 2,000 Å polysilicon layer as described above.

Figure 11:
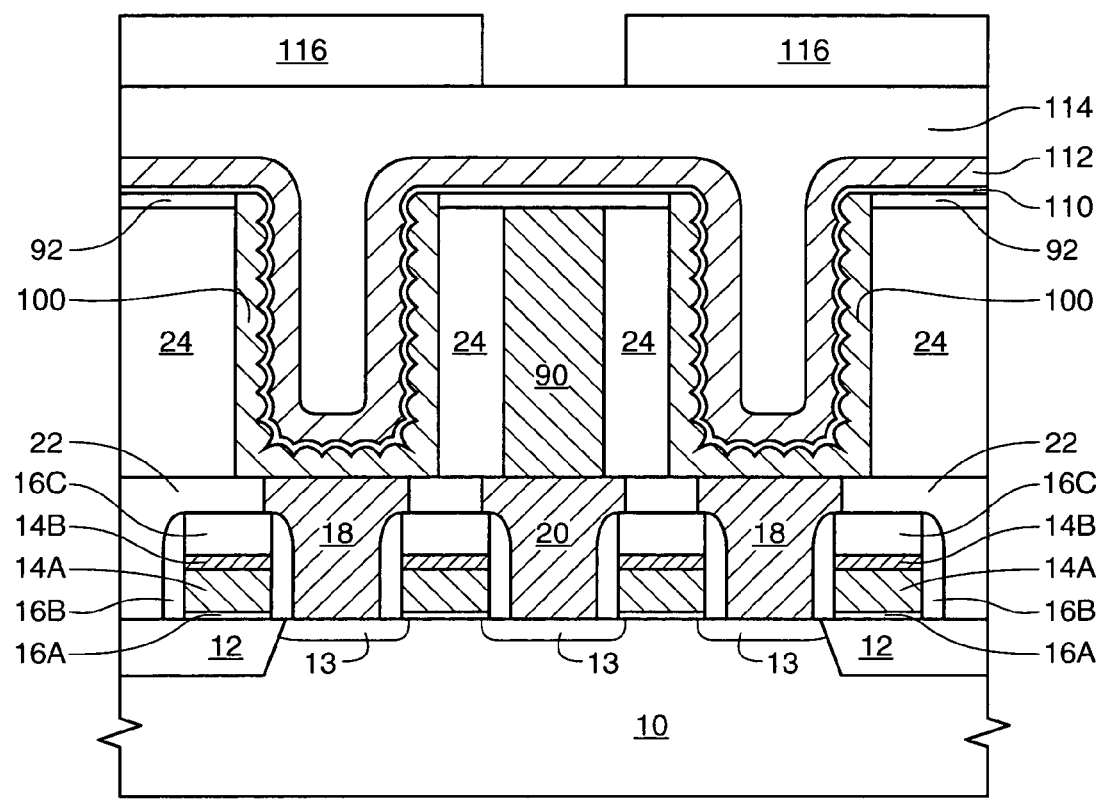
FIG. 11 depicts the FIG. 10 structure after a planarization step, after removing the photoresist layer, and after forming a cell dielectric layer, a capacitor top plate layer, a dielectric layer, and a patterned photoresist layer which defines openings to the digit line contact plug previously formed.
Figure 12:
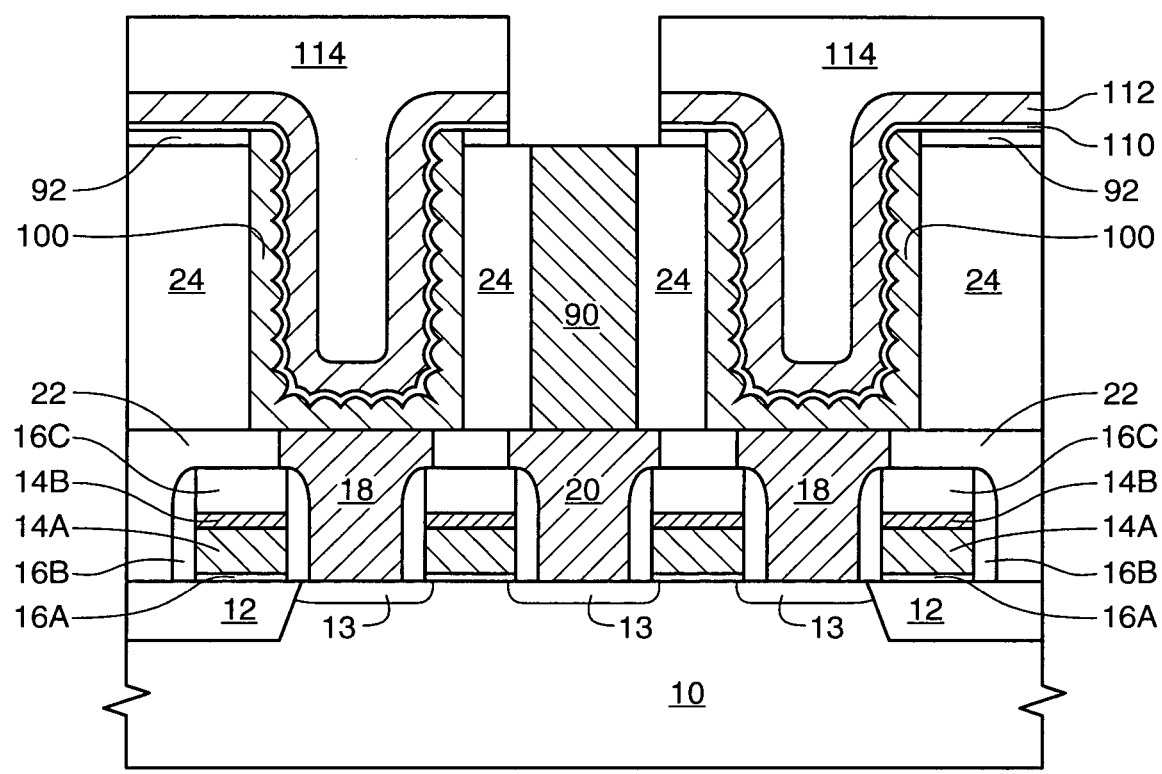
FIG. 12 depicts the structure of FIG. 11 subsequent to an etch which exposes the digit line contact plug.

A dielectric layer 114, for example BPSG between about 4,000 Å thick is formed and planarized. BPSG can be formed by employing an atmospheric pressure chemical vapor deposition (APCVD) system and silane, oxygen, phosphine ($PH_3$) and diborine ($B_2H_6$), and can be planarized using a reflow in a nitrogen purged atmospheric furnace at about 907° C. for about 25 minutes followed by a three hour anneal at about 800° C. The dielectric 114, in this exemplary embodiment 4,000 Å, is then patterned using a photoresist layer 116 formed over the BPSG layer 114 which defines an opening to the underlying digit line contact plug 90. The structure of FIG. 11 is etched using a vertical anisotropic etch, such as that described previously relative to BPSG adjusted for the present layer, which also etches the 2,000 Å of polysilicon 112, the 95 Å of cell nitride 110 and the 200 Å of dielectric 92 to expose the plug 90 as depicted in FIG. 12.

Figure 13:
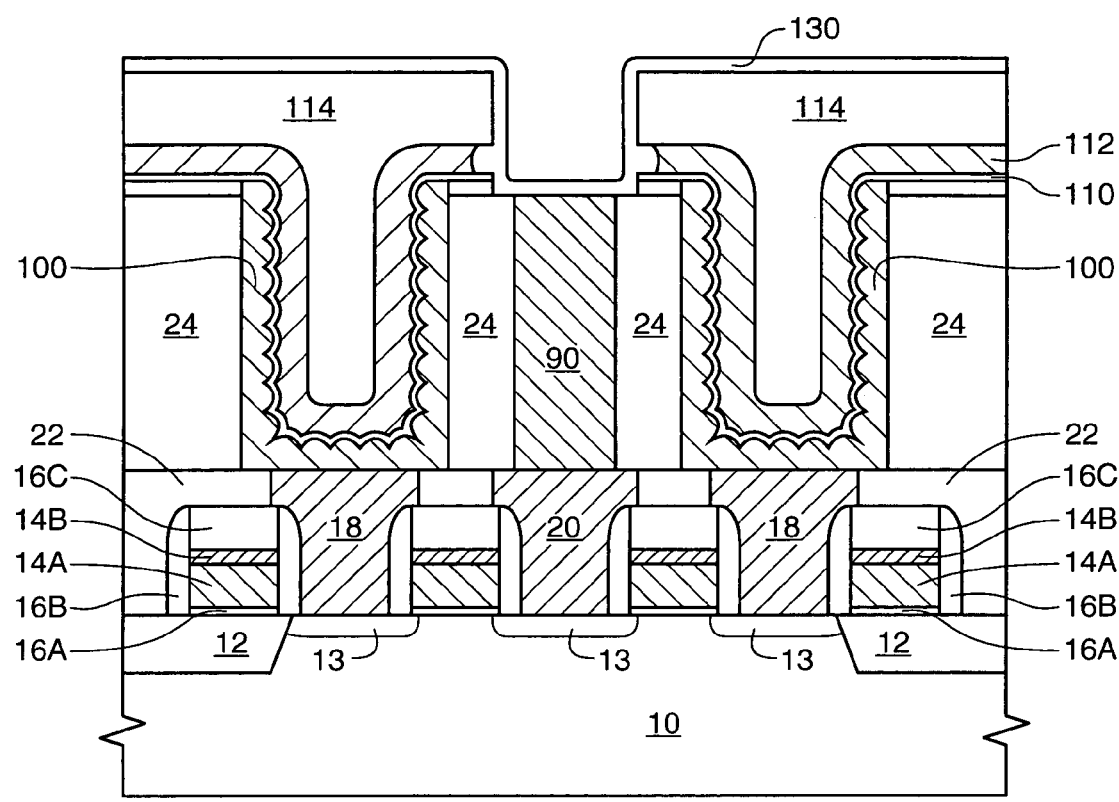
FIG. 13 depicts the structure of FIG. 12 subsequent to forming a spacer dielectric layer.

After exposing the digit line plug 90, a polysilicon etch is performed to recess the exposed polysilicon 112 between nitride 110 and BPSG layer 114 as depicted in FIG. 13. To adequately recess a polysilicon layer 525 Å thick, an etch comprising $Cl_2$ at a flow rate of about 7 sccm, $SF_6$ at a flow rate of about 25 sccm, He at a flow rate of about 35 sccm, $O_2$ at a flow rate of about 12 sccm, at a pressure of about 600 mTorr for about 18 seconds. After recessing the polysilicon 112, a dielectric layer is formed over the ends of polysilicon 112 which are exposed at the opening to the digit line plug 90. This can be accomplished by forming a dielectric layer 130 such as a conformal layer of nitride, or a planar layer such as TEOS, over exposed surfaces then performing a vertical spacer etch to result in the spacers 140 of FIG. 14. Alternately, a facet etch of the BPSG 114, for example using cations from an argon plasma to chip off protruding BPSG from the top corners of layer 114 and to redistribute or redeposit it to the sidewalls and to isolate polysilicon 112, would be sufficient and would eliminate the need for forming a separate dielectric layer. Such a process may be sufficient for any oxide or glass film with some modification, for example to adjust for various dopants which may affect the etch. It will be appreciated by one of ordinary skill in the art that this self-aligned isolation of the cell polysilicon reduces the possibility of shorting between the digit line plug and the cell polysilicon over conventional processes.

Figure 14:
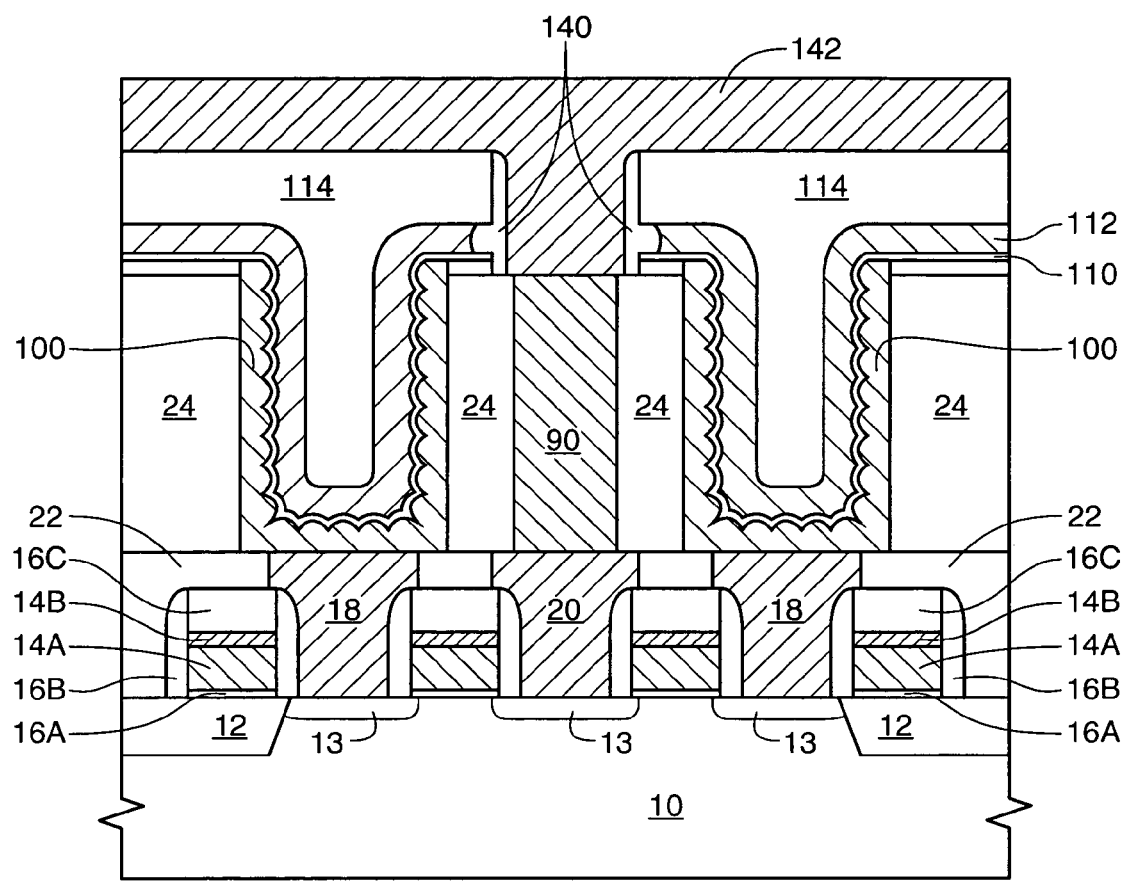
FIG. 14 depicts the FIG. 13 structure after an anisotropic etch of the spacer layer and the formation of a digit line runner layer which also forms a portion of the digit line contact plug.

After forming the dielectric layer 140 over the exposed ends of polysilicon layer 112, a patterned metal layer 142 such as titanium and aluminum/copper is formed to contact the digit line plug 90 as depicted in FIG. 14. In one exemplary metal deposition process, argon gas is changed into a plasma and the ions are used to bombard titanium and aluminum/copper targets. Atoms of metal material are sputtered from the metal target to the wafer surface to form layer 142.

The inventive process disclosed above has the advantage over conventional processes that an excessive dielectric thickness does not need to be etched to form the digit line plug and the aspect ratio of the contact plug opening is reduced. The plug opening is, in effect, etched using two separate etches. In the embodiment of the invention described above the two etches which define the plug are separated in time by an etch which defines the capacitor storage plate. Using the conventional process described herein in the Background of the Invention above, 18,000 Å of dielectric was etched through using a single etch to form the plug opening. With the instant process, 14,000 Å of oxide dielectric were removed from a first BPSG layer in a first etch. In a second etch, 4,000 Å of dielectric, 2,000 Å of polysilicon, 95 Å of cell nitride, and 200 Å of TEOS were removed to form a structure analogous to the plug of conventional processes. As the opening in each case is about 1,150 Å, the aspect ratio of the first oxide etch is about 12:1, and in the second etch the aspect ratio is about 5.5:1.

Figure 1:
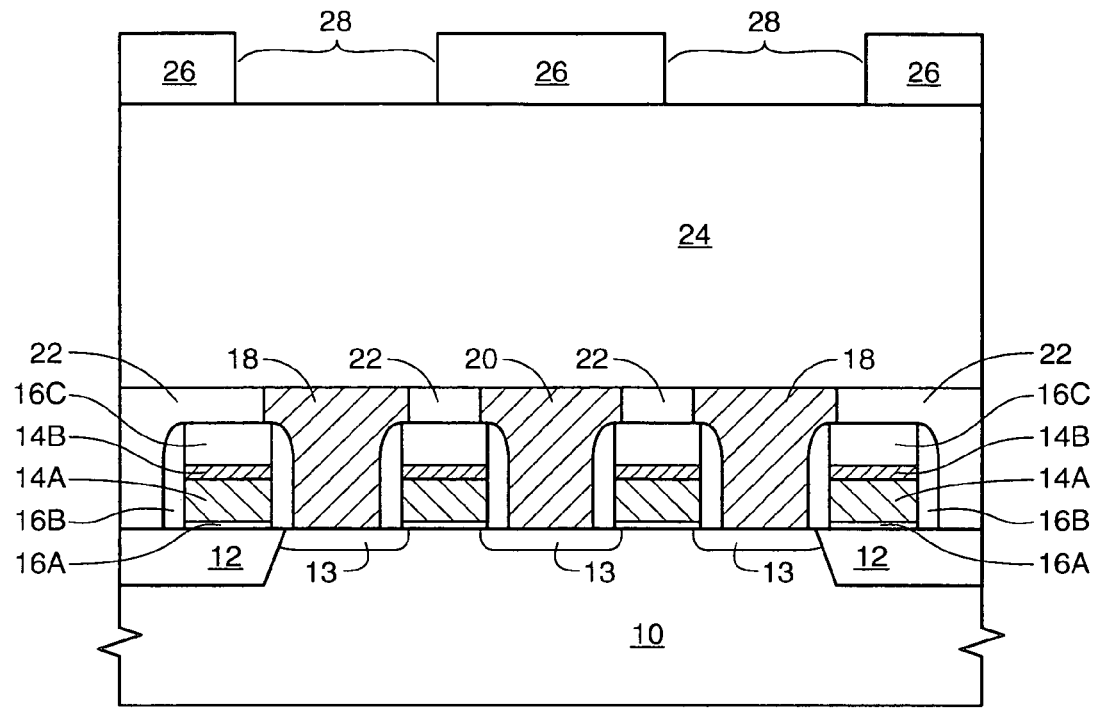
FIG. 1 is a cross section depicting an opening in a photoresist layer to define container capacitors within a dielectric layer.
Figure 2:
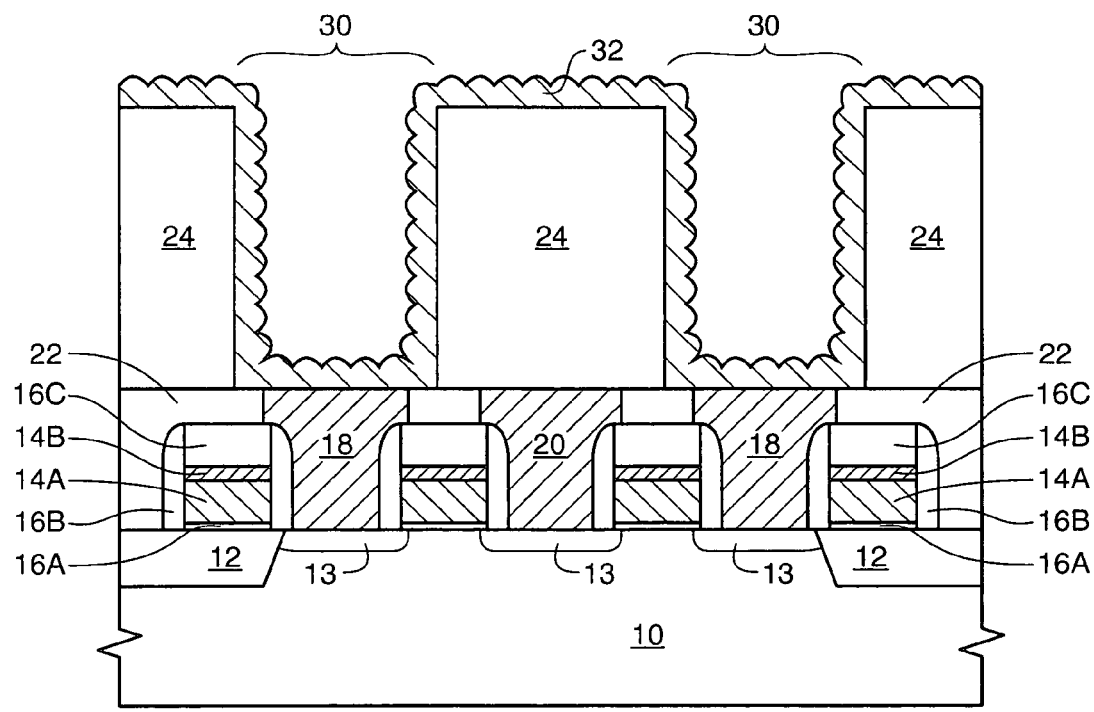
FIG. 2 depicts the FIG. 1 structure after etching the dielectric layer and forming a blanket hemispherical silicon grain (HSG) layer.
Figure 3:
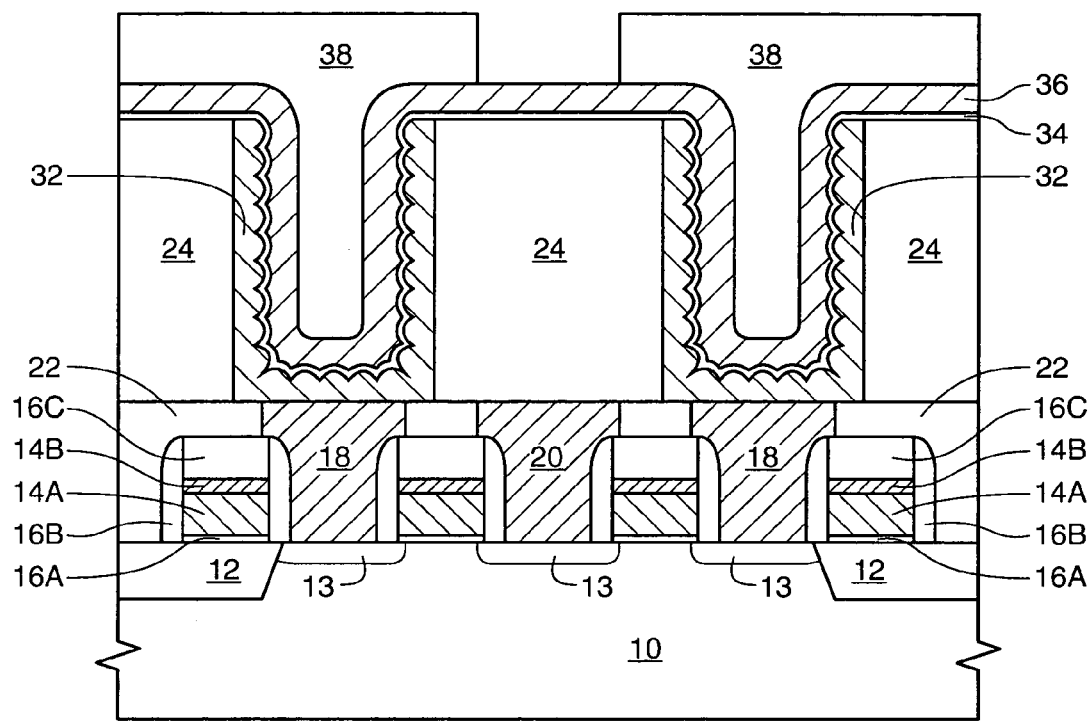
FIG. 3 is a cross section of the FIG. 2 structure subsequent to a planarization step and after forming a cell dielectric layer, a cell top plate layer, and a patterned photoresist layer to define a storage capacitor.
Figure 4:
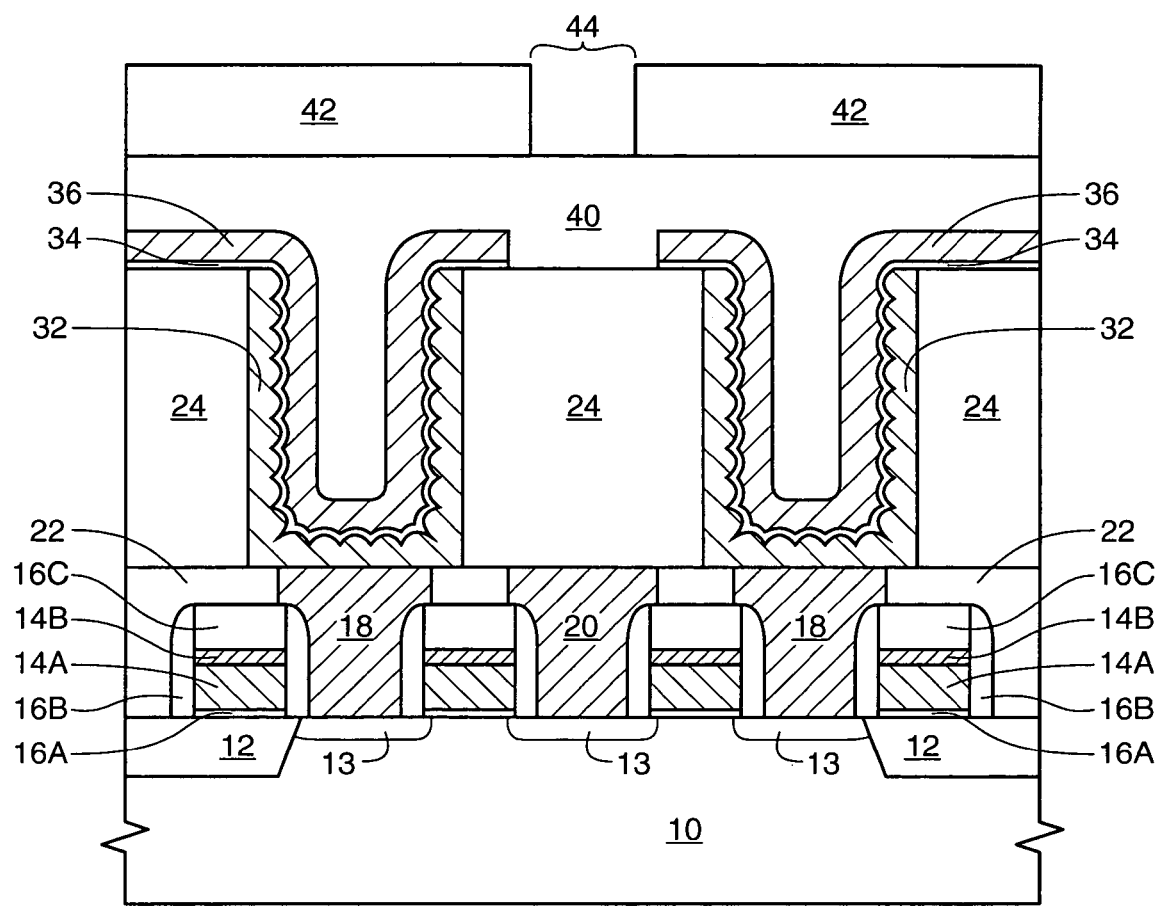
FIG. 4 is a cross section of the FIG. 3 structure after etching the cell dielectric and top plate, after formation of a planarized dielectric layer and formation of a patterned photoresist layer to define digit line contacts.
Figure 5:
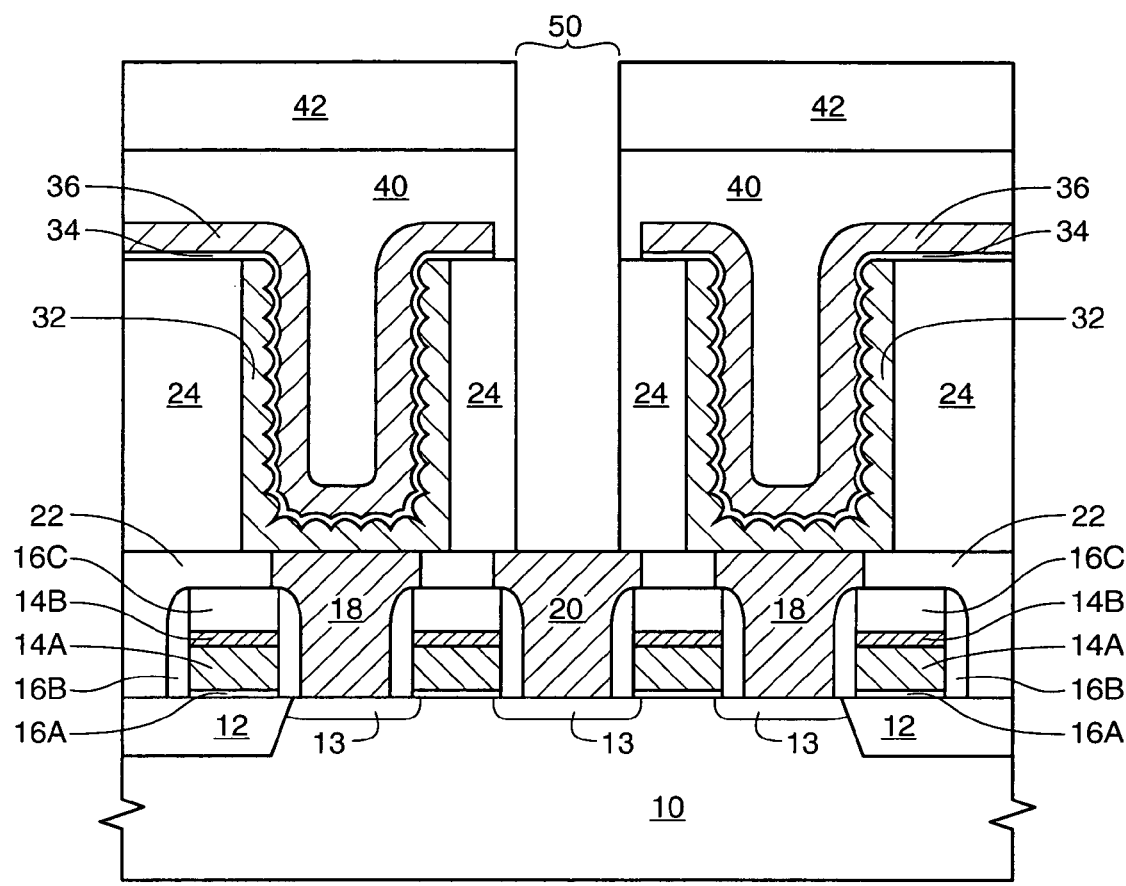
FIG. 5 is a cross section of the FIG. 4 structure after etching the digit line contact opening.
Figure 6:
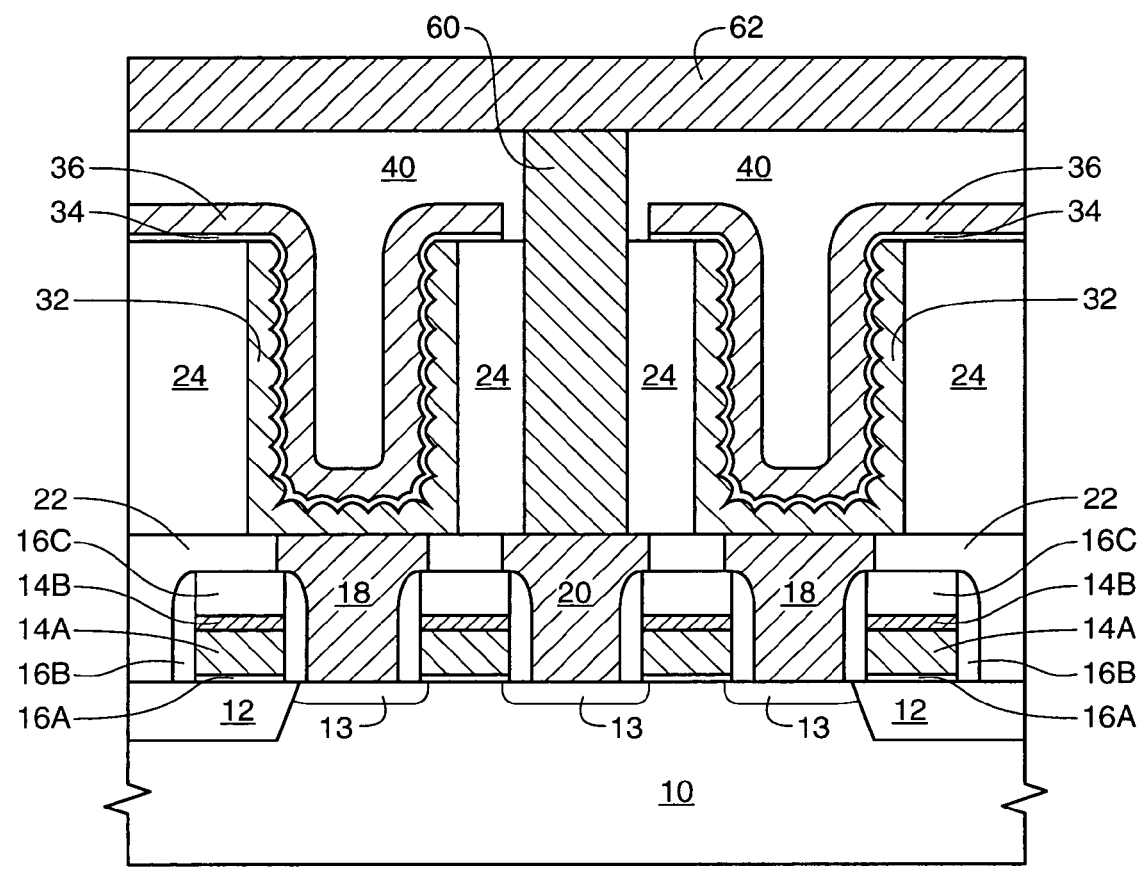
FIG. 6 is a cross section of the FIG. 5 structure after forming a contact plug and a metal runner to form a digit line.
Figure 15:
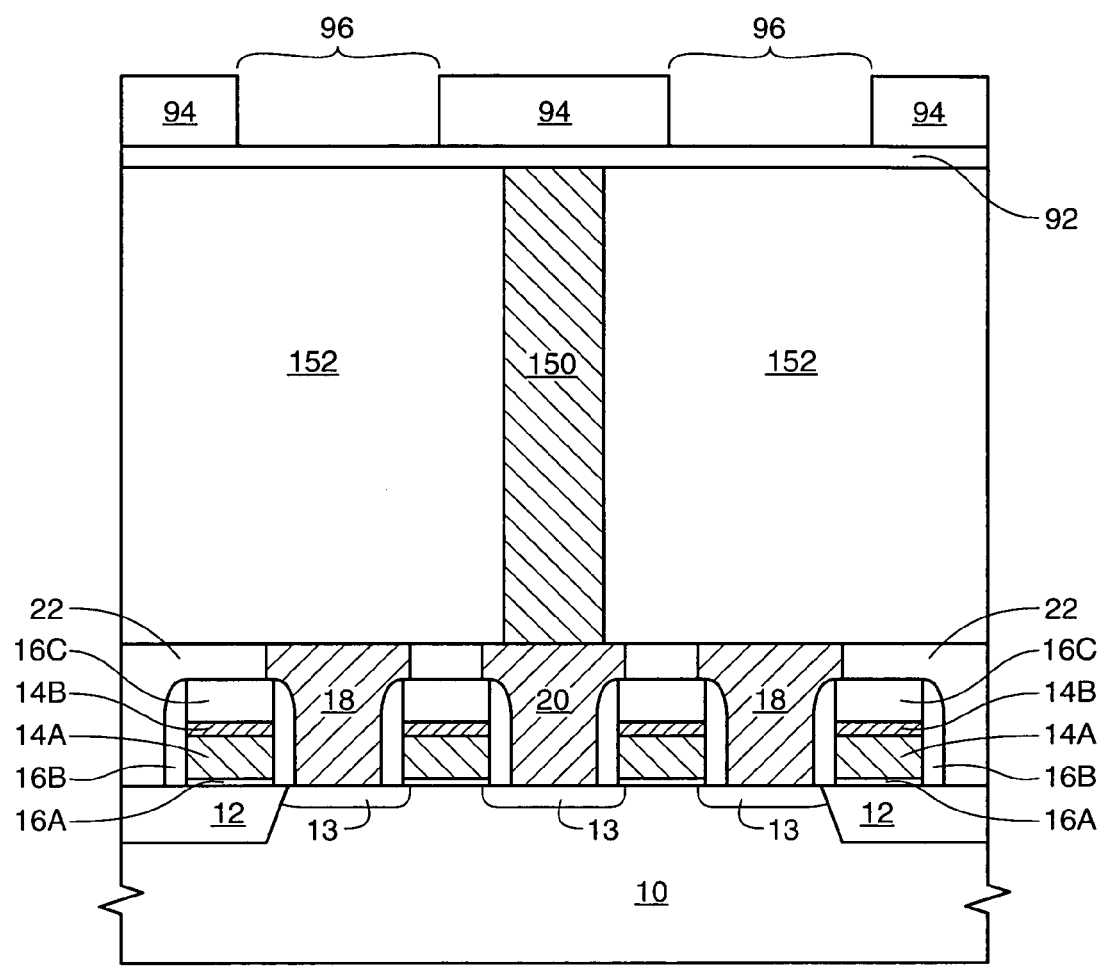
FIG. 15 depicts a cross section for a second embodiment of the invention similar to that of FIG. 9 having a digit line contact opening aspect ratio similar to that of conventional devices.
Figure 16:
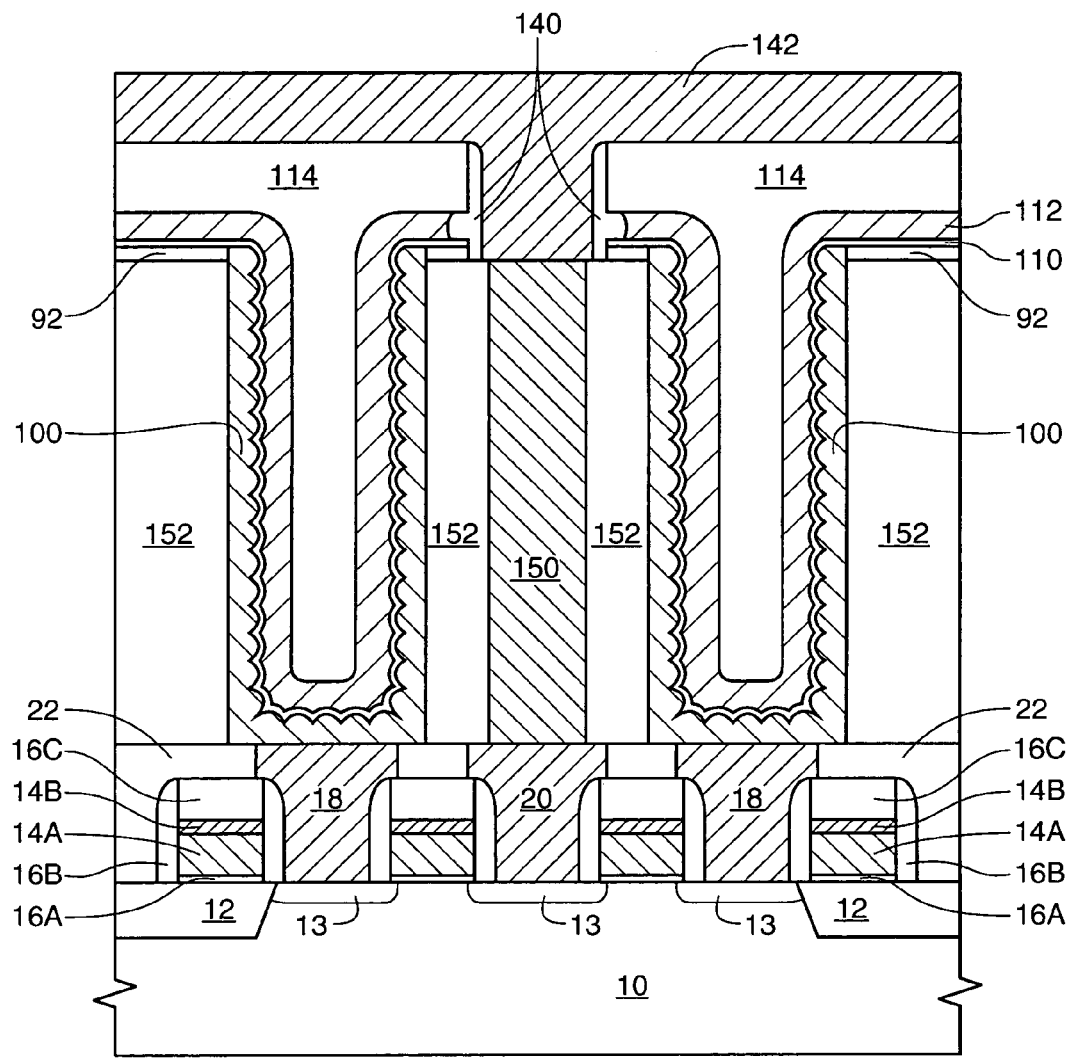
FIG. 16 depicts a cross section of the FIG. 15 structure after completion of various steps of the inventive embodiment.

In a second embodiment of the invention the aspect ratio of the conventional process is maintained for the etch of the FIG. 7 structure by forming a thicker layer 24, then the process is continued according to the first embodiment. With this second embodiment, a storage capacitor having a greater height and therefore a greater capacitance is formed. FIG. 15 depicts a structure similar to FIG. 9, except that the opening which forms plug 150 has the aspect ratio of the opening 50 of the conventional structure of FIG. 5. In this embodiment, dielectric layer 152 of FIG. 15 is about the same thickness as layers 24 and 40 (FIG. 5) combined. After forming the structure of FIG. 15, wafer processing continues as described above for the first inventive embodiment, adjusted for thicker layer 152, to result in the structure of FIG. 16. In comparing FIG. 16 and FIG. 14, the storage capacitor comprises a greater height and surface area, and therefore an increased capacitance, with no increase in horizontal spacing. Thus this embodiment has the advantage over the conventional process of FIGS. 1–6 that a larger storage capacitor is formed without increasing the aspect ratio of the digit line contact plug.

In a third embodiment of the invention, the digit line contact plug opening has an intermediate aspect ratio between that of the first and second inventive embodiments. This third embodiment reduces the digit line contact opening aspect ratio, and therefore the difficulty of the etch, but allows for a larger storage capacitor having a larger capacitance than is possible with conventional devices having a larger digit line contact opening aspect ratio.

It will be appreciated by one of ordinary skill in the art that various other features, such as silicide to improve polysilicon conductivity and various steps such as inspection and cleaning will be present depending on the design of the device which have been omitted from the FIGS. and description for simplicity of explanation.

Figure 17:
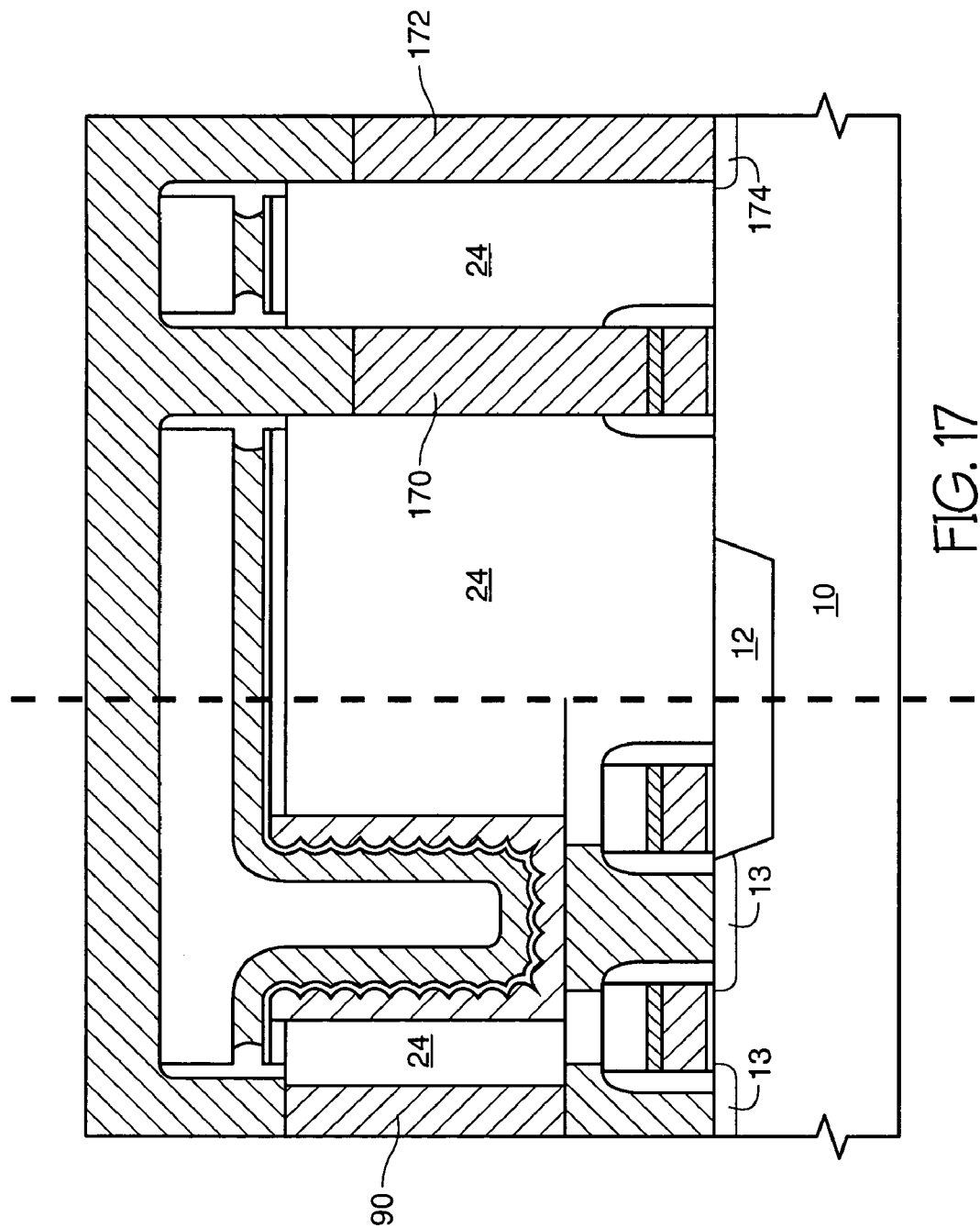
FIG. 17 is a cross section depicting various additional exemplary structures which can be formed during the process of FIGS. 9–16.

In another embodiment layer 92 may not be required. Layer 92 protects underlying layers during high-temperature processing of the wafer subsequent to its formation. For example, the formation of layer 142 may require a high-temperature anneal depending on the material used. High-temperature steps such as the anneal can result in oxidation of various substructures such as silicide 14B, some of which have contacts formed thereto, depicted as layer 170 in FIG. 17. If the silicide oxidizes, the electrical properties of the contact can be degraded, and layer 92 reduces or eliminates oxidation of underlying layers. If high-temperature steps are not required, it may be possible to eliminate layer 92. However, layer 92 requires no additional masking steps. FIG. 17 further depicts a contact plug 172 to a doped region 174 in the wafer 10 formed simultaneously with the other contact plugs 90, 170.

A semiconductor device formed in accordance with the invention may be attached along with other devices to a printed circuit board, for example to a computer motherboard or as a part of a memory module used in a personal computer, a minicomputer, or a mainframe. The inventive device can be useful in electronic devices related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A semiconductor device comprising:
   a semiconductor substrate assembly comprising:
   a semiconductor wafer;
   at least first and second doped areas in the wafer;
   a first contact pad electrically coupled to the first doped area and a second contact pad electrically coupled to the second doped area;
   a digit line contact plug portion comprising a lower surface and an upper surface wherein the upper surface is further away from the semiconductor substrate than the lower surface, and the lower surface contacts the first contact pad;
   a capacitor storage node comprising a lower surface and an upper surface wherein the upper surface of the storage node is further away from the semiconductor substrate than the lower surface of the storage node and is at least as far away from the semiconductor substrate as the upper surface of the digit line contact plug portion; and
   a dielectric layer interposed between the digit line contact plug portion and the capacitor storage node, and which contacts both the digit line contact plug portion and the capacitor storage node.

2. The semiconductor device of claim 1 wherein the lower portion of the storage node is closer to the semiconductor substrate than the upper surface of the digit line contact plug portion.

3. The semiconductor device of claim 1 wherein the digit line contact plug portion is a first portion, and the semiconductor device further comprises:
   a second digit line contact plug portion having a lower surface which contacts the upper surface of the first portion of the digit line contact plug;
   a capacitor top plate overlying the capacitor storage node; and
   a dielectric spacer which contacts the top plate and which contacts the second digit line contact portion.

4. The device of claim 3 further comprising:
   a capacitor dielectric layer interposed between the capacitor storage node and the capacitor top plate;
   a planarized dielectric layer overlying the capacitor top plate; and
   the spacer having a first portion which is recessed within an opening defined by the planarized dielectric layer and the capacitor dielectric layer and further having a second portion which is not recessed within the opening,
   wherein the first portion of the spacer overlies the capacitor dielectric layer and the second portion of the spacer does not overlie the capacitor dielectric layer.

5. The semiconductor device of claim 3 wherein the second digit line contact plug portion comprises a conductive runner which overlies the capacitor storage node.

6. A semiconductor device comprising:
   first and second spaced capacitor storage plates each having a generally horizontally-oriented lower surface, a generally horizontally-oriented upper surface, and a generally vertically-oriented surface interposed between the lower surface and the upper surface;
   a contact plug having a generally horizontally-oriented lower surface and a generally horizontally-oriented upper surface,
   wherein the contact plug is generally enclosed in an area which is defined, in cross section, by an upper boundary which extends from the upper surface of the first capacitor storage plate to the upper surface of the second capacitor storage plate, by a lower boundary which extends from the lower surface of the first capacitor storage plate to the lower surface of the second capacitor storage plate, and by a lateral boundary which is defined by the generally vertically-oriented surfaces of the first and second spaced capacitor storage plates; and
   a dielectric layer interposed between the contact plug and each of the first and second spaced capacitor storage plates, wherein the dielectric layer contacts each of the first and second spaced capacitor storage plates and the contact plug.

7. The device of claim 6 wherein the contact plug is a first contact plug and the semiconductor device further comprises:
- a first capacitor top plate paired with the first capacitor storage plate and a second capacitor top plate paired with the second capacitor storage plate; and
- a second contact plug having a lower surface which contacts the upper surface of the first contact plug and is interposed between the first and second capacitor top plates.

8. The device of claim 7 wherein the second contact plug further comprises an upper portion which provides a conductive runner, the conductive runner overlying the first and second capacitor storage plates.

9. The device of claim 7 further comprising:
- a semiconductor wafer having first, second, and third conductively doped regions therein;
- a first conductive contact pad electrically coupled with the first conductively doped region in the wafer, the lower surface of the first capacitor storage plate contacting the first conductive contact pad;
- a second conductive contact pad electrically coupled with the second conductively doped region in the wafer, the lower surface of the first contact plug contacting the second conductive contact pad; and
- a third conductive contact pad electrically coupled with the third conductively doped region in the wafer, the lower surface of the second capacitor storage plate contacting the third conductive contact pad.

10. The device of claim 6 wherein the contact plug is a first contact plug and the semiconductor device further comprises:
- a second contact plug having a lower surface which contacts the upper surface of the first contact plug and is interposed between the upper surface of the first capacitor storage plate and the upper surface of the second capacitor storage plate.

11. A semiconductor device comprising:
- a semiconductor wafer having a conductively-doped region therein;
- a first dielectric layer overlying the semiconductor wafer;
- a conductive contact pad formed within the first dielectric layer and electrically coupled with the conductively-doped region of the semiconductor wafer;
- a second dielectric layer;
- a first portion of a digit line contact plug within and contacting the second dielectric layer and electrically coupled with the contact pad;
- a capacitor storage node within and contacting the second dielectric layer;
- a capacitor top plate layer having a portion overlying the storage node and overlying the first portion of the digit line contact plug, and further having an opening therein; and
- a second portion of the digit line contact plug within the opening in the capacitor top plate layer.

12. The semiconductor device of claim 11 further comprising:
- first and second cross-sectional sidewalls in the top plate layer; and
- first and second cross-sectional spacers which electrically insulate the capacitor top plate layer from the second portion of the digit line contact plug.

13. The semiconductor device of claim 1 wherein a majority of a thickness of the dielectric layer is interposed between the digit line contact plug portion and the capacitor storage node.

14. The semiconductor device of claim 6 wherein a majority of a thickness of the dielectric layer is interposed between the contact plug and each of the first and second spaced capacitor storage plates.

15. The semiconductor device of claim 11 wherein a majority of a thickness of the second dielectric layer is interposed between the first portion of the digit line contact plug and the capacitor storage node.

16. A semiconductor device comprising:
- a semiconductor substrate assembly comprising a first contact pad and a second contact pad;
- a digit line contact plug portion comprising a lower surface and an upper surface wherein the upper surface is further away from the semiconductor substrate than the lower surface, and digit line contact plug portion is electrically coupled with the first contact pad;
- a capacitor storage node comprising a lower surface and an upper surface wherein the upper surface of the storage node is further away from the semiconductor substrate than the lower surface of the storage node and is at least as far away from the semiconductor substrate as the upper surface of the digit line contact plug portion;
- a capacitor dielectric layer overlying the capacitor storage node;
- a capacitor top plate overlying the capacitor storage node;
- a dielectric layer overlying the capacitor top plate; and
- a spacer having a first portion which contacts the capacitor top plate and which is recessed within an opening defined by the dielectric layer and the capacitor dielectric layer and further having a second portion which is not recessed within the opening.

17. The semiconductor device of claim 16 wherein the dielectric layer overlying the capacitor top plate is a first dielectric layer and the semiconductor device further comprises a second dielectric layer interposed between the digit line contact plug portion and the capacitor storage node, wherein the second dielectric layer contacts both the digit line contact plug portion and the capacitor storage node.

18. The semiconductor device of claim 17 wherein a majority of a thickness of the second dielectric layer is interposed between the digit line contact plug portion and the capacitor storage node.

* * * * *